United States Patent [19]
Lysobey

[11] 4,074,209
[45] Feb. 14, 1978

[54] WIDE RANGE FREQUENCY MODULATION OF NARROW LOOP BANDWIDTH PHASE-LOCKED OSCILLATORS

[75] Inventor: Morris Lysobey, Cherry Hill, N.J.

[73] Assignee: RCA Corporation, New York, N.Y.

[21] Appl. No.: 749,981

[22] Filed: Dec. 13, 1976

[51] Int. Cl.² ............................................. H03C 3/22
[52] U.S. Cl. ....................................... 332/19; 325/148; 331/23; 331/36 C; 331/117 R; 331/177 V; 332/16 T; 332/22; 332/23 R; 332/30 V
[58] Field of Search .............. 332/19, 22, 23 R, 30 V, 332/16 T; 331/23; 325/148

[56] References Cited

U.S. PATENT DOCUMENTS

| | | | |
|---|---|---|---|
| 3,414,842 | 12/1968 | Broadhead, Jr. | 332/19 |
| 3,622,913 | 11/1971 | Shipley | 332/19 X |

*Primary Examiner*—Siegfried H. Grimm
*Attorney, Agent, or Firm*—H. Christoffersen; Samuel Cohen; Carl M. Wright

[57] ABSTRACT

Frequency-modulated phase-locked loop oscillator with a special modulator bypassing the phase-locked loop to inject modulation voltage directly into the voltage-controlled oscillator of the loop to broaden the bandwidth of modulation.

3 Claims, 4 Drawing Figures

WIDE RANGE FREQUENCY MODULATION OF NARROW LOOP BANDWIDTH PHASE-LOCKED OSCILLATORS

The Government has certain rights in this invention pursuant to Contract No. DAAB07-71-C-0182 awarded by the Department of the Army.

This invention relates to frequency modulation using a phase-locked loop to generate the carrier frequency.

Using a phase-locked loop to generate a carrier frequency for frequency modulation is well known in the art. In a phase-locked loop, the output signal from a voltage-controlled-oscillator (VCO) is compared to the phase of a reference signal to produce an error signal which, after processing by a low-pass filter, is applied to the VCO to control the frequency of oscillation. Frequency modulation of the output signal is accomplished by using a frequency modulated signal as a reference input signal to the loop phase comparator. The resulting changes in the error signal cause variations in the oscillator output signal frequency corresponding to the frequency of the modulating signal. The frequency response of the so transferred modulation is limited, however, by the loop parameters.

In many indirect frequency generating schemes using digital frequency selection, presettable dividers are used to reduce the frequency from the output signal before phase comparison to allow the output frequency to be a predetermined or selectable multiple of the average reference frequency. The higher the division ratio — and, consequently, the lower the reference frequency — the narrower becomes the loop bandwidth and the modulation frequency response.

For stable operation, phase-locked loops require narrow loop bandwidths. The bandwidth is a function of the capture capability (lock-in range) and the noise loop bandwidth. The transfer function of a phase-locked loop is used to calculate the noise loop bandwidth and can be expressed in several ways. For example, the loop transfer function $H(s)$ is the ratio of output phase $\theta_0(s)$ from the VCO to the phase $\theta_i(s)$ of the input signal, i.e., $H(s) = \theta_0(s)/\theta_i(s)$. Alternatively, the loop transfer function can be expressed as the ratio of the input voltage, $V_F(s)$ to the VCO to the modulating voltage, $V_m(s)$, or $H(s) = V_F(s)/V_m(s)$.

The transfer function can also be expressed as a function of the loop gain K and the filter function $F(s)$, that is, $$H(s) = \frac{KF(s)}{s + KF(s)}.$$

The loop noise bandwidth $B_L$ for a phase-locked loop is given by $$B_L = \frac{1}{2\pi j} \int_{-j\infty}^{j\infty} H(s)H(-s)ds$$

where the integration is performed around the Bromwich contour in the left-hand half-plane with $\sigma = 0$. The transfer function of the filter and the loop gain therefore determine the bandwidth, steady state error, error stability, and loop stability. A first order loop, i.e., a loop having a filter with the transfer function $F(s) = 1$, has a noise loop bandwidth of $K/4$. A first order loop, however, has a limited capture ability. The higher the order of the filter, the wider the lock-in range of the phase-locked loop. A third order loop, however, is complicated and unstable in the absence of complicated proper controls. As a practical compromise, a second order loop is usually used and has a narrow bandwidth which in turn limits the dynamic range of modulation.

In a system embodying the invention, there is a circuit for producing a frequency-modulated output signal including: a reference modulator for producing a reference signal from a modulating signal, and a phase-locked loop having a voltage-controlled-oscillator producing an output signal in response to a control signal. The system also includes a phase discriminator for comparing the phases of the output signal and the reference signal to produce an error signal corresponding to their difference in phase, and a filter for producing a filtered error signal. A VCO modulator is used to produce a correction signal from the modulating signal, and the correction signal and error signal are combined to produce the control signal to the voltage-controlled-oscillator.

Figure 1:
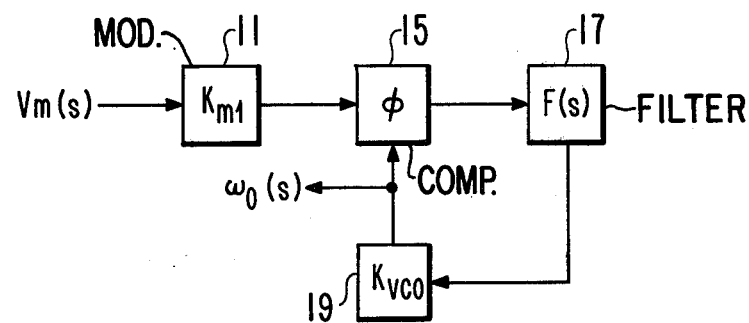
FIG. 1 is a block diagram of a prior art circuit using a phase-locked loop for FM modulation.
Figure 2:
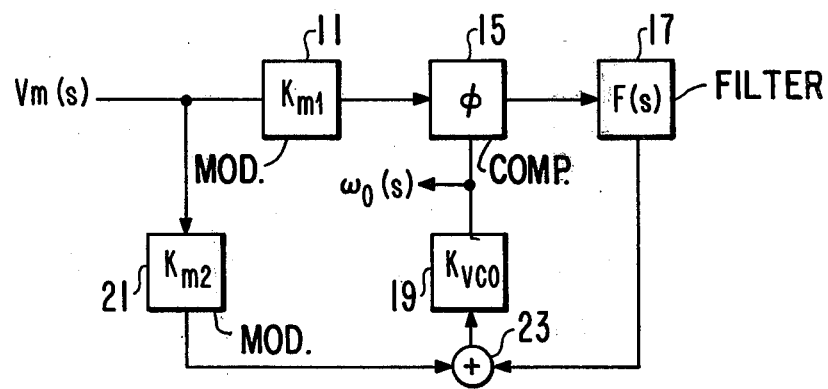
FIG. 2 is a block diagram of an embodiment of the invention.

The block diagrams of a typical prior art circuit in FIG. 1 and an embodiment of the invention in FIG. 2 show the basic elements of a phase-locked loop with a modulating input voltage, $V_m$, for controlling the output signal, $\omega_0$. Not shown in the block diagrams is a frequency divider between the output side of the voltage-controlled-oscillator and the input side of the phase comparator. A frequency divider permits a large ratio between the output signal from the oscillator and the modulation voltage. In the analysis which follows, the frequency divider ratio (a constant) can be considered as part of the sensitivity of the voltage-controlled oscillators. (Sensitivity is the ratio of response to cause.)

The operation of the prior art circuit in FIG. 1 is most easily described in the complex s-domain to avoid convolution integrals. The input modulation voltage, $V_m(s)$, is applied to a reference modulator 11 whose sensitivity is represented by $K_{m1}$, measured in radians-per-second per volt. The output signal from the reference modulator 11 can be expressed as $$\theta_i(s) = K_{m1}V_m(s)/s \tag{1}$$

because phase is the integral of frequency.

The output signal from the reference modulator 11 is applied as one input signal to a phase comparator 15. The other input signal to the phase comparator 15 is the output signal from a VCO 19. The sensitivity of the VCO 19 is given as $K_{VCO}$, also in units of rad/sec/volt. If $V_f(s)$ is the input control voltage to the VCO 19, then the output signal $\omega_0(s)$ from the VCO 19 is $$\omega_0(s) = K_{VCO}V_f(s) \tag{2}$$

or, in terms of phase, $$\theta_0(s) = K_{VCO}V_f(s)/s. \tag{3}$$

The phase $\theta_e(s)$ of the output signal from the phase comparator 15 is, therefore, $$\theta_e(s) = \theta_i(s) - \theta_0(s), \quad (4)$$

where $\theta_i(s)$ is the phase of the input signal to VCO 19. The output signal of the phase comparator 15 is the input signal to a loop filter 17 — usually a low-pass filter — whose output signal is $V_r(s)$ given by $$V_r(s) = \theta_e(s)F(s). \quad (5)$$

By substituting equations (1) and (3) into equation (4) and the latter into equation (5), equation (2) becomes $$\omega_0(s) = \frac{K_{VCO}K_{m1}V_m(s)}{\frac{S}{F(s)} + K_{VCO}} \quad (6)$$

This is equivalent to $$\omega_0(s) = K_{m1}V_m(s)H(s). \quad (7)$$

where $H(s)$ is the transfer function of the loop, i.e., $$H(s) = \frac{K_{VCO}F(s)/s}{1 + K_{VCO}F(s)/s}. \quad (8)$$

Since $F(s)$ is in units of volts per radian, $H(s)$ is dimensionless. The voltage transfer function is $$\frac{V_r(s)}{V_m(s)} = \frac{K_{m1}}{K_{VCO}} H(s).$$

The phase-locked loop response is the major limitation of the modulation frequency response, principally because of the loop filter. By making the system output signal independent from the loop transfer function or response, the major system limitation becomes the time constant of the VCO tuning mechanism itself.

FIG. 2 shows one embodiment of the invention for making the system output signal independent from the phase-locked loop transfer function. In addition to the circuit elements shown in FIG. 1, there are included a VCO modulator 21 and an adder 23. The sensitivity $K_{m2}$ of the VCO modulator 21 is dimensionless and this modulator may therefore be implemented as an attenuator or amplifier (as examples). The adder 23 is inserted in the phase-locked loop.

The operation of the circuit of FIG. 2 is also best explained in the complex domain. The input voltage $V_F(s)$ to the VCO 19, is the output voltage from the adder 23. $V_F'(s)$ is the $V_F(s)$ output signal with the connection to the VCO modulator 21 opened, or $V_F'(s) = V_r(s)$, where $V_r(s)$ is defined above. Opening the input signal connection to the reference modulator 11 results in $\theta_i(s) = 0$ and $V_r'(s)$ as the output signal from the filter 17. Therefore, if $V_m'(s)$ is the output signal from the VCO modulator 21, $$V_F''(s) = V_m'(s) + V_r'(s).$$

where $V_F''(s)$ is the output signal from the adder 23 with the reference modulator 11 open-circuited.

Since $$V_m'(s) = K_{m2}V_m(s)$$

and $$V_r'(s) = -\theta_0(s)F(s),$$

then $$V_F''(s) = K_{m2}V_m(s) - \theta_0(s)F(S).$$

Substituting $$\theta_0(s) = \frac{K_{VCO}V_F''(s)}{S},$$

the result is $$V_F''(s) = \frac{K_{m2}V_m(s)}{1 + \frac{K_{VCO}F(s)}{S}} = K_{m2}V_m(s)[1 - H(s)].$$

Since $V_F'(s)$ was found in FIG. 1 to be $$\frac{K_{m1}V_m(s)}{K_{VCO}} H(s)$$

and since by superposition $V_F(s) = V_F'(s) + V_F''(s)$, then $$V_F(s) = \frac{K_{m1}V_m(s)}{K_{VCO}} H(s) + K_{m2}V_m(s)[1 - H(s)]$$

from which the voltage transfer function is found to be $$\frac{V_F(s)}{V_m(s)} = K_{m2} - (K_{m2} - \frac{K_{m1}}{K_{VCO}}) H(s). \quad (9)$$

From equation (7), it is clear that if $$K_{m2} = (K_{m1}/K_{VCO}),$$

then the coefficient of $H(s)$ becomes zero. The output signal will then be $$\omega_0(s) = K_{VCO}V_F(s) = K_{VCO}K_{m2}V_m(s).$$

Thus, the output signal has been made independent from the phase-locked loop transfer function and is limited principally by the time constant of $K_{VCO}$.

Figure 3:
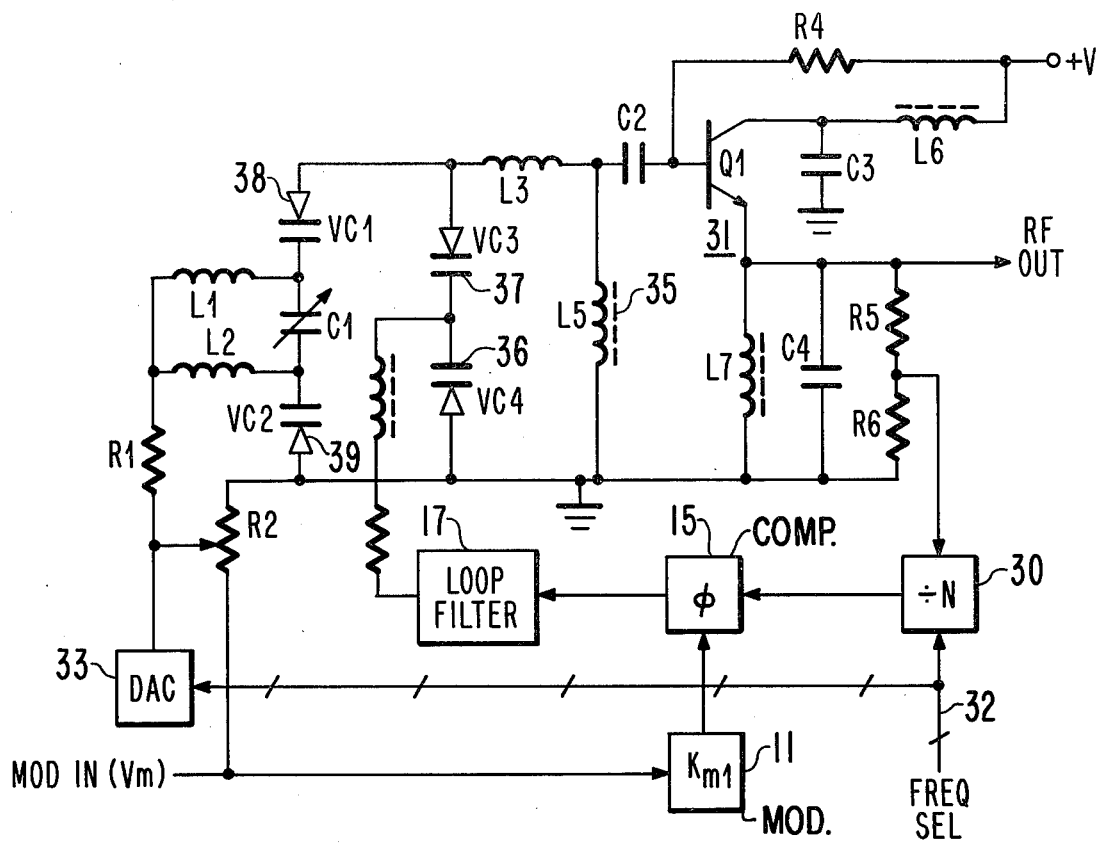
FIG. 3 is a schematic showing an implementation of an embodiment of the invention.

FIG. 3 is schematic of a practical implementation of the system shown in the block diagram of FIG. 2. The modulation input voltage is applied to a reference modulator 11, the output signal from which is compared by a phase discriminator or comparator 15 to the output signal from a divider 30. The output signal from the phase discriminator 15 is applied to a loop filter 17. These elements are well known in the art and are the same as described in connection with the circuits in FIGS. 1 and 2. The VCO comprises an oscillator including a transistor 31. An inductor 35 and two varactor diodes 36 and 37 comprise the frequency determining tank circuit of the oscillator. The output signal from the loop filter 17 is applied to the junction of the varactors 36 and 37, for controlling the reverse bias applied to these varactors, and thus their capacitance, to vary the oscillator frequency.

The output signal from the emitter of the transistor 31 is sampled by a voltage divider comprising resistors R5 and R6. The sampled signal is applied to the divide-by-$n$ counter 30. The value of $n$ is selected by a binary signal (FREQ SEL) over a bus 32.

The VCO modulator comprises a pair of varactors 38 and 39 with a trimmer capacitor C1 between their cathodes, all in parallel across the varactors 36 and 37 of the tank circuit of the VCO. The modulating signal, $V_m$, is applied across a potentiometer R2 from which a portion of the signal is picked off by the wiper arm of the potentiometer R2 and applied to the varactors 38 and 39 through a resistor R1 and RF chokes L1 and L2. The resulting changes in the capacitances of the varactors 38 and 39 change the oscillator-frequency. The frequency changes caused by the changes in varactor capacitance of the varactors 36–39 are additive and it is for this reason that the function of this circuit is represented in FIG. 2 by the adder 23.

The center frequency of the output signal is determined by the value of $n$ in the divide-by-$n$ counter 30. As the frequency is changed by selecting various values of $n$, the sensitivity $K_{VCO}$ of the VCO will vary. This will in turn vary the required ratio $K_{m1}/K_{VCO}$ and thus require a change in the value of $K_{m2}$. In order to keep the phase-locked loop independent from the loop response, the binary signal applied over bus 32 is also applied to a digital-to-analog converter (DAC) 33 to supply a signal which biases the VCO modulator in a direction to correct for the change in the VCO sensitivity, $K_{VCO}$.

Figure 4:
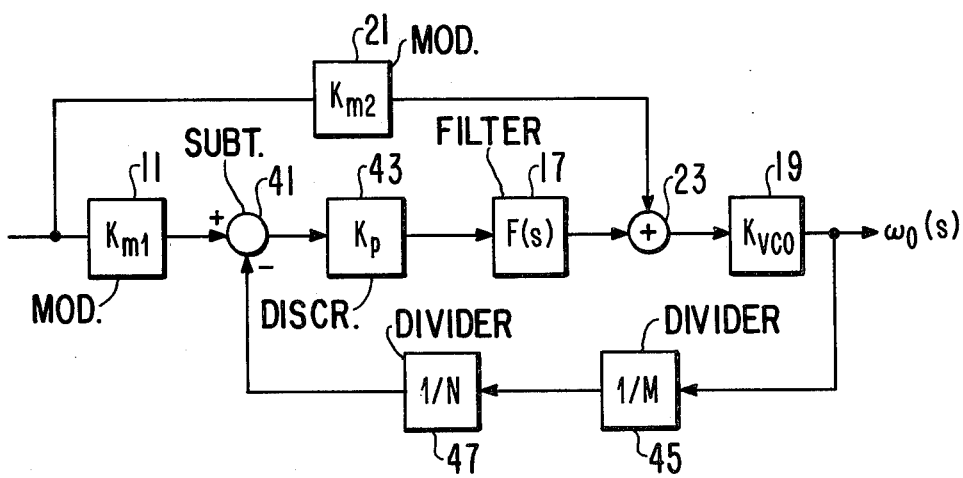
FIG. 4 is an alternate block diagram representation of an embodiment of the invention.

In the block diagram of FIG. 4, a variation of the block diagram of FIG. 2, a reference modulator 11 provides an input signal to a phase subtractor 41 whose output signal is converted to a voltage by a phase discriminator 43. The output signal from the phase discriminator 43 is passed through a loop filter 17 to an adder 23. The other input signal to the adder 23 is the output signal from the VCO modulator 21. The output signal from the adder 23 serves as the control voltage of the VCO 19 which produces an output signal which is also applied to a fixed prescaler 45. The output signal from the fixed prescaler 45 is coupled to a programmable divider 47, the output signal from which provides an input signal to the phase subtractor 41. The output signal from the programmable counter 47 can be characterized as $\theta_0(s)/MN$. The analysis of the circuit in FIG. 4 is the same as that for FIG. 2, but includes the scaling down of the output signal before the phase comparison is made.

What is claimed is:

1. In a circuit for producing a frequency-modulated output signal, including reference modulator means responsive to a modulating signal for producing a reference signal and phase-locked loop means having voltage-controlled-oscillator means responsive to a control signal for producing said output signal, phase discriminator means responsive to said output signal and to said reference signal for producing an error signal proportional to the difference in phase between said output signal and said reference signal, the improvement comprising:

VCO modulator means reponsive to the modulating signal for producing a correction signal, the VCO modulator means including means for amplifying said modulating signal by a factor proportional to the ratio of the sensitivity of said reference modulator means to the sensitivity of said voltage-controlled-oscillator; and combining means responsive to the error signal and said correction signal for supplying said control signal to said voltage-controlled-oscillator means.

2. The invention as claimed in claim 1 further including:

frequency divider means coupled between said voltage-controlled-oscillator means and said phase discriminator means for reducing the frequency of said output signal before being applied to said phase discriminator means;

frequency selection means for supplying a signal for varying the frequency of the output signal;

biasing means responsive to said frequency selection means for supplying a bias signal to said VCO modulator means to compensate for changes in the sensitivity of said voltage-controlled-oscillator means; and means for coupling the signal from said frequency selection means to said frequency divider means for controlling the frequency division ratio.

3. The invention as claimed in claim 2 wherein said voltage-controlled-oscillator means includes first varactor means responsive to said error signal for controlling the frequency of the output signals;

wherein said VCO modulator means includes second varactor means responsive to said modulating signal for varying the bias across said second varactor means; and wherein said combining means includes means for coupling together said first and second varactor means.

* * * * *